(12) United States Patent (10) Patent No.: US 7,989,303 B2
Van Haren (45) Date of Patent: Aug. 2, 2011

(54) METHOD OF CREATING AN ALIGNMENT MARK ON A SUBSTRATE AND SUBSTRATE

(75) Inventor: Richard Johannes Franciscus Van Haren, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 45 days.

(21) Appl. No.: 12/345,113

(22) Filed: Dec. 29, 2008

(65) Prior Publication Data

US 2009/0166899 A1 Jul. 2, 2009

Related U.S. Application Data

(60) Provisional application No. 61/009,197, filed on Dec. 27, 2007.

(51) Int. Cl.
*H01L 21/76* (2006.01)

(52) U.S. Cl. ...... 438/401; 438/717; 430/5; 257/E23.179

(58) Field of Classification Search ............ 438/107, 438/690, 717, 736, 401; 356/401, 364, 400; 430/5

See application file for complete search history.

(56) References Cited

U.S. PATENT DOCUMENTS

| | | | |
|---|---|---|---|
| 7,330,261 B2* | 2/2008 | Van Haren et al. | 356/401 |
| 2005/0064676 A1* | 3/2005 | Tobioka et al. | 438/401 |
| 2007/0076205 A1* | 4/2007 | Schulz | 356/401 |
| 2008/0002213 A1* | 1/2008 | Weiss | 356/620 |

* cited by examiner

*Primary Examiner* — Hsien Ming Lee

(74) *Attorney, Agent, or Firm* — Sterne, Kessler, Goldstein & Fox P.L.L.C.

(57) ABSTRACT

In an embodiment, a method of creating an alignment mark on a substrate includes forming a plurality of lines segmented into electrically conducting line segments and space segments, thereby forming spaces between the lines to form a macroscopic structure in a first layer of the substrate, creating a plurality of electrically conducting trenches in a second layer of the substrate, and arranging the plurality of trenches to be in electrical contact with the line segments and overlapping the space segments at least partially.

7 Claims, 8 Drawing Sheets

METHOD OF CREATING AN ALIGNMENT MARK ON A SUBSTRATE AND SUBSTRATE

CROSS-REFERENCE TO RELATED APPLICATIONS

The present application claims the benefit of U.S. Provisional Patent Appl. No. 61/009,197, filed Dec. 27, 2007, which is incorporated by reference herein in its entirety.

BACKGROUND

1. Field

Embodiments of the invention relate to a method of creating an alignment mark on a substrate and a substrate formed by the method.

2. Background

In integrated circuit (IC) production, lithography is used to produce multiple stacked and overlapping circuit patterns. The production of such overlapping circuit patterns includes exposing a layer of photo-resist on a wafer. By exposing a first layer of photo-resist to a first pattern followed by some additional process steps, a first pattern is created on the wafer. Likewise, a second pattern is created on the wafer after some intermediate process steps including applying a second layer of photo-resist. The second pattern should very accurately overlap the first pattern, because at specific positions the first and the second pattern will be electrically connected. These connections are provided by intermediate vias which are formed by exposing a third layer of photo-resist on the wafer (before applying and exposing the second layer). The vias themselves need to be accurately positioned relative to the first and the second pattern.

In order to position the vias to the first layer and the second layer to the vias, alignment marks are used. A first alignment mark is typically formed by exposing the first layer of photo-resist to an alignment mark pattern followed by some additional steps. Before exposing the third layer of photo-resist, the position of the first alignment mark in the first layer is measured and the third layer is exposed in such a way that vias will be accurately positioned above the first pattern. Likewise, a second alignment mark is formed by exposing the third layer of photo-resist to an alignment mark pattern followed by some additional steps. Before exposing the second layer of photo-resist, the position of the second alignment mark is measured. The second layer is then exposed in such a way that the second pattern will be accurately positioned above the vias.

Known alignment marks (or markers) are gratings including lines and spaces. The position of the alignment gratings is measured by alignment radiation. In order to assure that the alignment radiation does not activate photo-resist, the alignment radiation has a wavelength which differs considerably from the wavelength used in exposure radiation for exposing photo-resist. Roughly, the scale of the lines of the alignment mark is of the order of magnitude of the wavelength of the alignment radiation, and the scale of the smallest features of the circuit patterns is of the scale of the wavelength of the exposure radiation. Because of tolerances in the exposure process used to expose both the circuit patterns as the alignment patterns in one and the same layer of photo-resist, the difference in scale can cause an unwanted shift between the alignment mark and the circuit pattern in a certain photo-resist layer. To prevent this, the lines of the alignment marker are segmented to line segments and space segments so that the features actually exposed when exposing the alignment pattern are of a scale comparable to the scale of the smallest features of the circuit patterns.

Alignment performance depends on the contrast of the alignment markers, which is based on differences in reflectance of alignment radiation between the lines (which are reflecting) and spaces (which are non-reflecting) of the alignment mark.

However, by segmenting the lines of the alignment marker, the contrast of the alignment marker is reduced. This can be understood by visualizing that the area of the reflecting lines is decreased by the area of the non-reflecting space segments.

SUMMARY

The inventor has invented a method that increases the contrast of alignment markers.

According to an embodiment of the invention, there is provided a method of creating an alignment mark on a substrate, including forming a plurality of lines segmented into electrically conducting line segments and space segments, thereby forming spaces between the lines to form a macroscopic structure in a first layer of the substrate; and creating a plurality of electrically conducting trenches in a second layer of the substrate, thereby arranging the plurality of trenches to be in electrical contact with the line segments and arranging the plurality of trenches to overlap the space segments at least partially.

Because the plurality of trenches at least partially overlaps the space segments and because the plurality of trenches is in electrical contact with the line segments, the overlapped part of the space segments contributes to reflecting alignment radiation.

According to an embodiment of the invention, there is provided a substrate formed by the foregoing method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 5A:
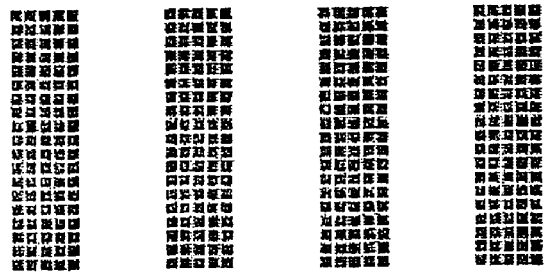
Figure 5B:
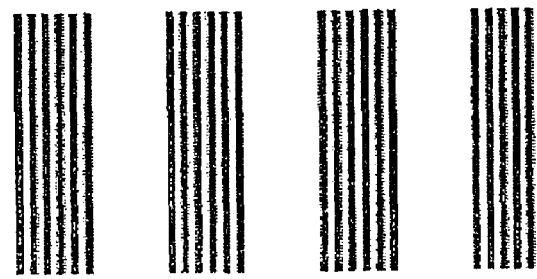
Figure 5C:
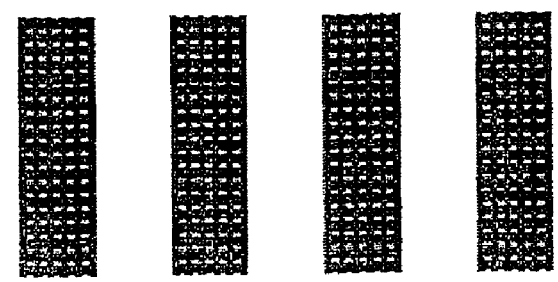

FIGS. 5a, 5b, and 5c depict alignment patterns and marks according to an embodiment of the present invention.

Figure 6A:
Figure 6A:
Figure 6A:
Figure 6A:
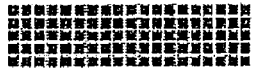
Figure 6B:
Figure 6B:
Figure 6B:
Figure 6B:
Figure 6C:
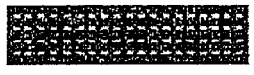
Figure 6C:
Figure 6C:
Figure 6C:
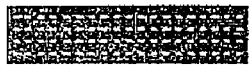

FIGS. 6a, 6b, and 6c depict alignment patterns and marks according to a further embodiment of the present invention.

Figure 7A:
Figure 7A:
Figure 7A:
Figure 7A:
Figure 7B:
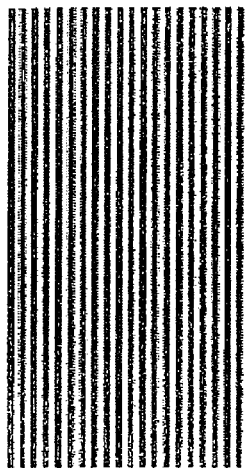
Figure 7C:
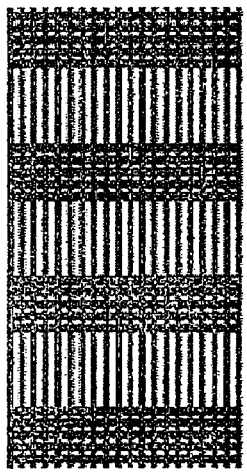

FIGS. 7a, 7b, and 7c depict alignment patterns and marks according to a further embodiment of the present invention.

Figure 8A:
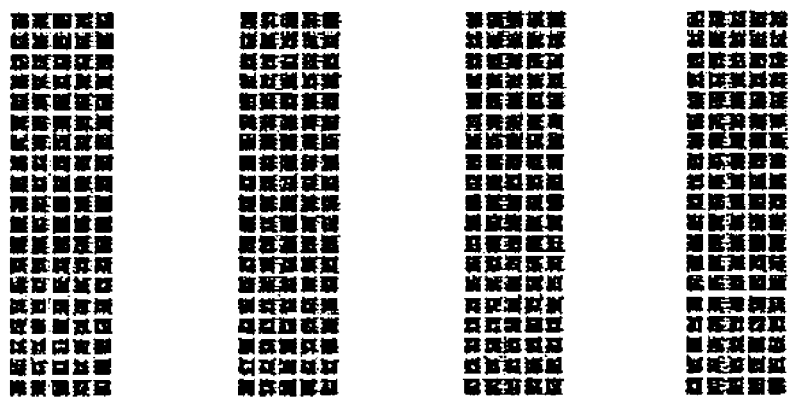
Figure 8B:
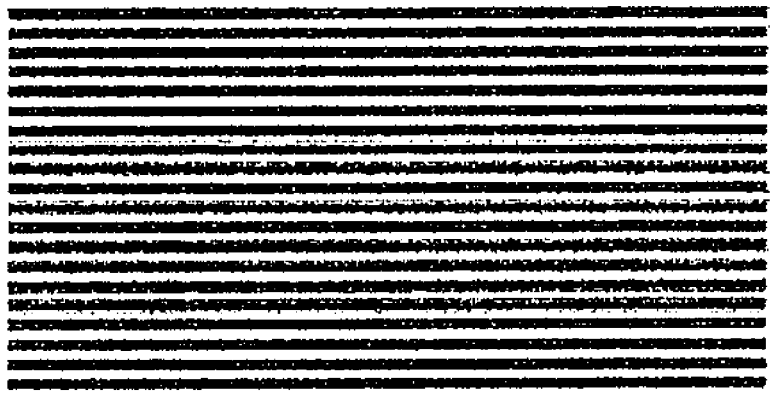
Figure 8C:
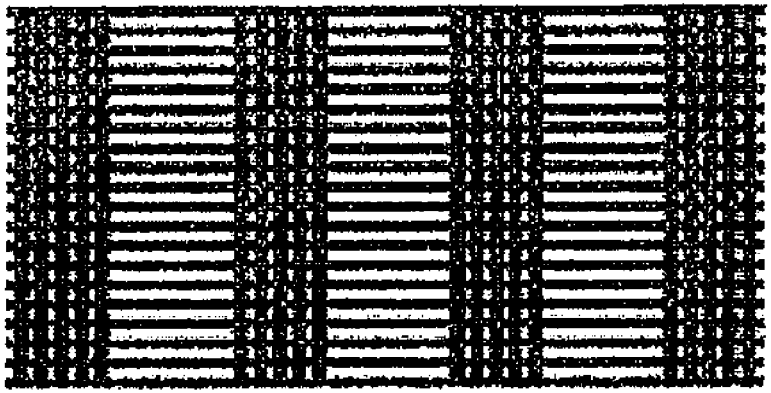

FIGS. 8*a*, 8*b*, and 8*c* depict alignment patterns and marks according to a further embodiment of the present invention.

Figure 9A:
Figure 9A:
Figure 9A:
Figure 9A:
Figure 9B:
Figure 9C:
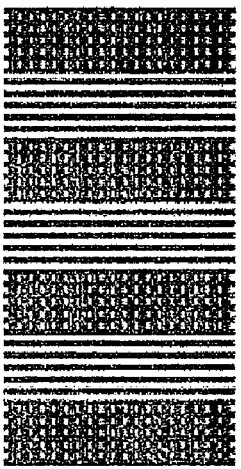

FIGS. 9*a*, 9*b*, and 9*c* depict alignment patterns and marks according to a further embodiment of the present invention.

Figure 10A:
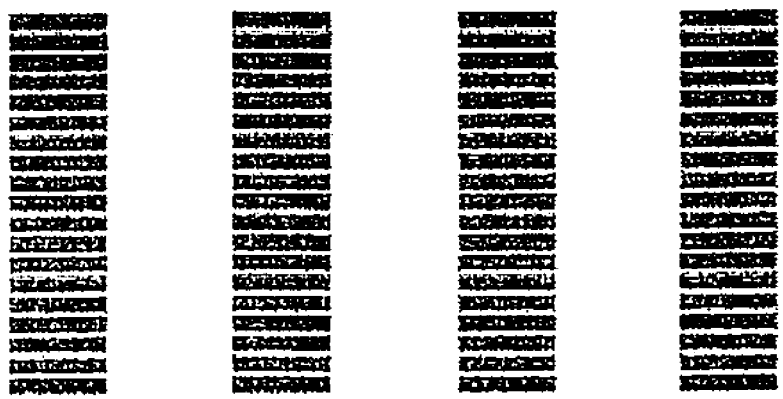
Figure 10:
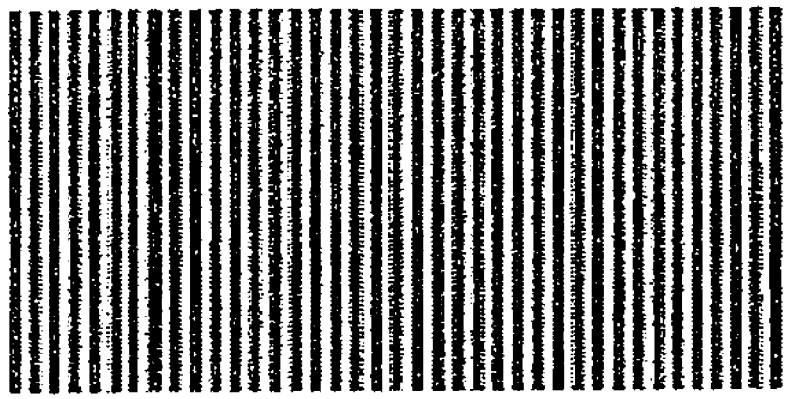
Figure 10C:
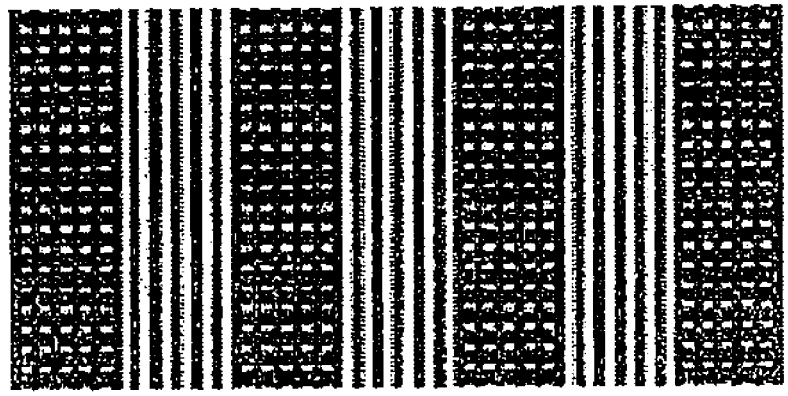

FIGS. 10*a*, 10*b*, and 10*c* depict alignment patterns and marks according to a further embodiment of the present invention.

Figure 11A:
Figure 11A:
Figure 11A:
Figure 11A:
Figure 11B:
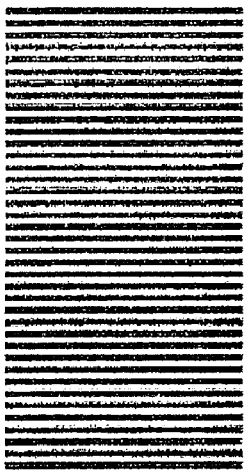
Figure 11C:
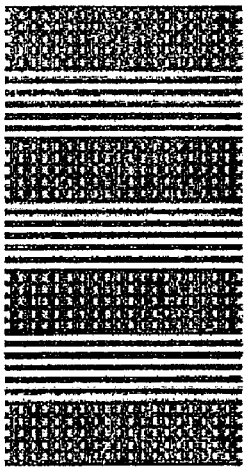

FIGS. 11*a*, 11*b*, and 11*c* depict alignment patterns and marks according to a further embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
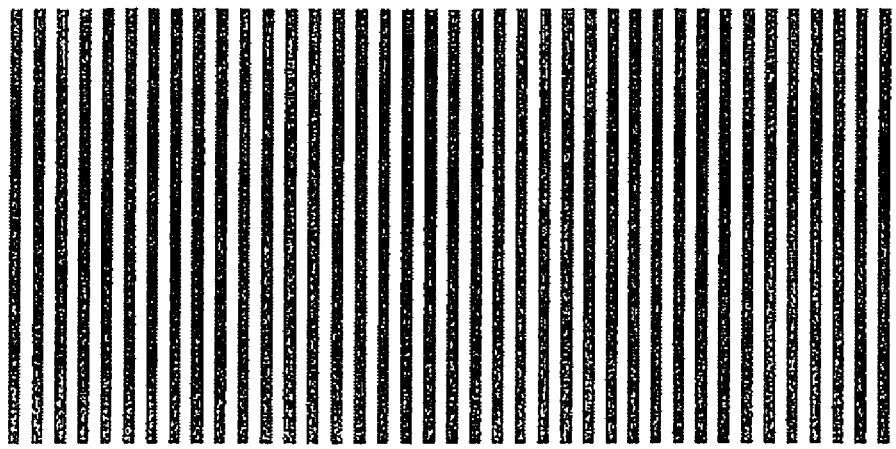
FIG. 1 depicts a line and space pattern according to an embodiment of the present invention.

In a method according to an embodiment of the invention, a first layer of photo-resist on a wafer is exposed to a pattern including plurality of lines segmented into line segments and space segments (FIG. 1). In another step of the method, the first layer is exposed to a pattern of vias. In a further step of the method, the line segments are filled with an electrically conducting material, such as aluminum (Al), silver (Ag) or tungsten (W). The lines, which are separated by spaces, form a macroscopic structure of a scale which comparable to alignment radiation.

Figure 2:
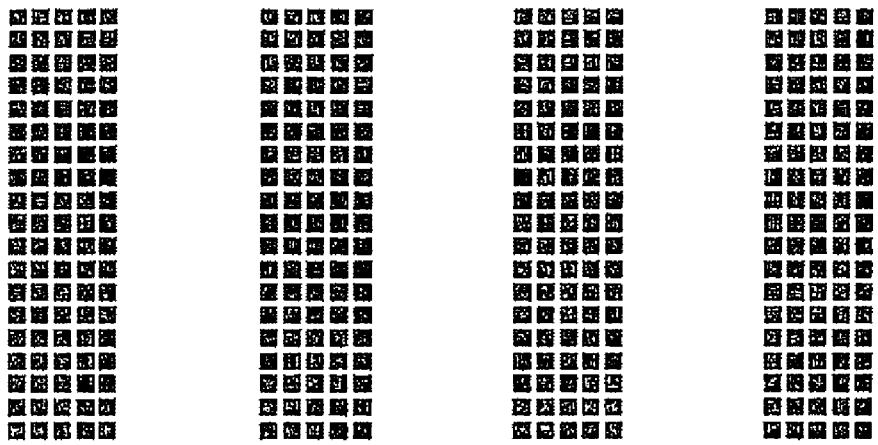
FIG. 2 depicts a pattern of trenches according to an embodiment of the present invention.
Figure 3:
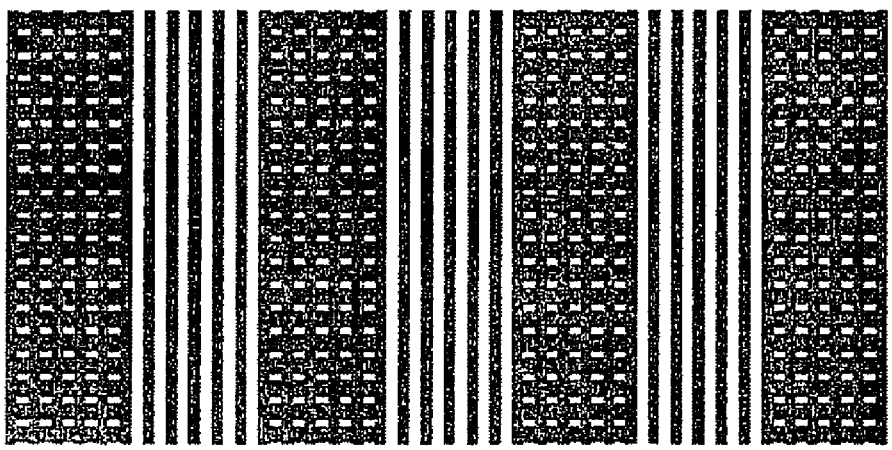
FIG. 3 depicts an alignment mark according to an embodiment of the present invention.
Figure 4:
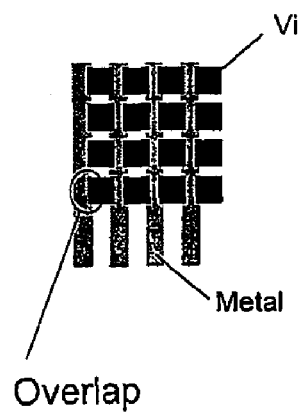
FIG. 4 depicts an enlarged view of a portion of the alignment mark of FIG. 3.

Then, a second photo-resist layer is applied to the wafer. The photo-resist layer is exposed to a circuit pattern which is intended to form a so-called metal-layer. The photo-resist layer is further exposed to a pattern of trenches (FIG. 2). The trenches are positioned to overlap the space segments at least partially (FIGS. 3 and 4). In further steps of the method, the trenches are filled with an electrically conducting material, such as aluminum (Al), silver (Ag) or tungsten (W).

For forming another circuit pattern on the wafer, a further layer of photo-resist is applied to the wafer. Before exposing the further layer of photo-resist to the circuit pattern, the position of the alignment mark is determined by an alignment sensor. The alignment sensor uses alignment radiation to illuminate the alignment mark and detects the radiation reflected by the alignment mark. It uses the difference in reflection by the lines and spaces to determine the position.

In an embodiment of the invention, the lines form a periodic grating, and the alignment sensor includes a detection grating and a radiation sensor. The radiation sensor is arranged to measure the amount of radiation reflected by the alignment mark on the wafer and transmitted through the detection grating. The alignment mark determines the position of the alignment mark by measuring the position of the wafer where the amount of radiation measured by the radiation sensor is maximal.

The invention encompasses multiple embodiments with different arrangements of the lines and trenches as indicated in FIGS. 5 to 11, a to c.

In each figure, the a-figure relates to the pattern in the via-layer, the b-figure relates to the pattern in the metal layer, and the c-figure relates to the combined pattern of the overlapping patterns.

In the embodiments of FIGS. 5(*a*,*b*,*c*), 4 sets of trenches are used. Each set includes a plurality of trenches on a periodic grating. The sets are separated by separation spaces. Each set includes two trenches (one on each end of the set) which are in a semi-dense configuration as they have a neighboring trench on the one side and a separation space on the other side. However, such semi-dense lines are subject to other process deviations when producing dense lines. As a result, a marker with more semi-dense lines gives less alignment accuracy.

In the embodiment of FIGS. 6(*a*,*b*,*c*), 4 sets of trenches are again used. Each set also has two semi-dense lines (one on each end of the set). The alignment marks of FIGS. 6(*a*,*b*,*c*) suffer from the same process deviation as the alignment marks of the embodiment of FIGS. 5(*a*,*b*,*c*).

The embodiment corresponding to FIGS. 1, 2 and 3, as well as the embodiments corresponding to FIGS. 7(*a*,*b*,*c*), 8(*a*,*b*,*c*), 9(*a*,*b*,*c*), 10(*a*,*b*,*c*) and 11(*a*,*b*,*c*), have the additional advantage over the embodiments of FIGS. 5(*a*,*b*,*c*), 6(*a*,*b*,*c*) that the trenches are formed in only 1 set. The complete alignment mark only has 2 trenches (1 at each end) formed in a semi-dense configuration. Therefore, the alignment marks according to the embodiment of FIGS. 1, 2 and 3 as well as the embodiments corresponding to FIGS. 7(*a*,*b*,*c*), 8(*a*,*b*,*c*), 9(*a*,*b*,*c*), 10(*a*,*b*,*c*) and 11(*a*,*b*,*c*) can be used to give more accurate alignment results.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of creating an alignment mark on a substrate, comprising:

forming a plurality of sets of lines, the lines in each set being segmented into electrically conducting line segments and space segments, thereby forming spaces between the sets of lines to form a macroscopic structure in a first layer of the substrate, wherein the sets of lines are separated by spaces that are larger than the space segments; and creating one set of electrically conducting trenches in a second layer of the substrate, wherein the trenches are in electrical contact with the line segments and are arranged to at least partially overlap the space segments.

2. A method according to claim 1, farther comprising segmenting the lines in each set in two directions.

3. A method according to claim 1, wherein the electrically conducting line segments or trenches comprise at least one of aluminum, silver and tungsten.

4. A method according to claim 1, further comprising determining a position of the alignment mark based on macroscopic properties of the alignment mark including the position of the macroscopic structure.

5. A method according to claim 1, wherein a dimension of each of the space segments is substantially identical, in that they are periodic.

6. A method according to claim 1, wherein the trenches are spaced substantially uniformly, in that they are periodic.

7. A method according to claim 1, wherein each of the trenches comprises an electrically conductive material.

* * * * *